United States Patent [19]
Maeda

[11] Patent Number: 5,428,308
[45] Date of Patent: Jun. 27, 1995

[54] DIRECT DIGITAL SYNTHESIZER AND PHASE LOCKED LOOP FREQUENCY SYNTHESIZER

[75] Inventor: Kazuo Maeda, Chiba, Japan

[73] Assignee: Uniden Corporation, Chiba, Japan

[21] Appl. No.: 162,982

[22] Filed: Dec. 8, 1993

[30] Foreign Application Priority Data

Dec. 8, 1992 [JP] Japan .................. 4-327781

[51] Int. Cl.⁶ .................. H03K 3/80; H03L 7/18
[52] U.S. Cl. .................. 327/106; 331/18; 331/25
[58] Field of Search .......... 331/1 A, 18, 19, 25; 328/14, 16; 327/106

[56] References Cited

U.S. PATENT DOCUMENTS

| | | | |
|---|---|---|---|
| 4,905,177 | 2/1990 | Weaver, Jr. et al. | 364/721 |
| 4,926,130 | 5/1990 | Weaver | 328/14 |
| 4,965,533 | 10/1990 | Gilmore | 331/18 |
| 5,081,603 | 1/1992 | Mikos | 364/718 |

FOREIGN PATENT DOCUMENTS

WO9115056 10/1991 WIPO .

OTHER PUBLICATIONS

Electronics World & Wireless World, vol. 97, No. 1678, Sep. 1992, Surrey GB pp. 746–748 "Direct Digital Synthesis".

IEEE Colloquium on "Direct Digital Frequency Synthesis", Nov. 19, 1991, IEE, London, UK pp. 5.1–5.4 M. Bozic Spurious Redistributing Direct Digital Synthesizer (SRDDS).

IEEE Colloquium on "Direct Digital Frequency Synthesis", Nov. 19, 1991, IEE, London, UK pp. 4.1–4.5 M. P. Wilson et al. Spurious Reduction Techniques for Direct Digital Synthesis.

Electronics World and Wireless World, vol. 98, No. 1678, Oct. 1992, Surrey GB pp. 842–845, XP 315541 Ian Hickman "Genuine solutions to spurious arguments".

Electronics World and Wireless World, Oct. 1991, Surrey GB pp. 845–846, XP000264833 Ian Hickman "Design brief: voltage references".

*Primary Examiner*—Siegfried H. Grimm
*Attorney, Agent, or Firm*—Lowe, Price, LeBlanc & Becker

[57] ABSTRACT

A direct digital synthesizer which can be switched at a high speed and generates signals having a relatively high frequency with low power consumption; including a clock generator, a frequency setting circuit in which phase increment for unit clock can be programmed, a phase accumulator in which phase increment is accumulated, a ROM which outputs a digital signal corresponding to cumulative phase output, a D/A convertor which inverts polarity of output in each clock time, and a band-pass filter. The output of the band pass filter may be used as a reference input to a phase locked loop.

8 Claims, 8 Drawing Sheets

DIRECT DIGITAL SYNTHESIZER AND PHASE LOCKED LOOP FREQUENCY SYNTHESIZER

FIELD OF THE INVENTION

The present invention relates to a frequency synthesizer which can generate a plurality of frequencies by switching, and more particularly a frequency synthesizer which can switch frequencies at a high speed with low power consumption rate and without losing phasic continuity in frequency switching.

BACKGROUND OF THE INVENTION

In a conventional type of frequency synthesizer, as shown in FIG. 6, a signal 2 indicating a reference frequency $f_0$ generated from a reference signal generator 1 is supplied as input to a phase comparator 3, and a signal 7 obtained by dividing output from a voltage controlled oscillator (VCO) 5 with a frequency divider circuit 6 is connected to another input terminal of a phase comparator 3 for comparison of the phases. Output 8 from phase comparator 3 is supplied as input to a loop filter 4 and then connected to the VCO 5 to control the VCO, thus a feedback loop being completed. Frequency division ratio N of the frequency divider circuit 6 is programmable, so that it is possible to obtain output from the VcO as a synthesizer output of $N \times f_0$ due to convergence of the feedback loop. Generally a loop filter fully intercepts a reference frequency component, so that a time required for convergence of a feedback loop is limited to a value corresponding to a cycle of the reference frequency or below. For this reason, a conventional type of feedback loop can not be applied as it is to a synthesizer which requires a relatively high switching time.

As means for solving the problem in the conventional type of frequency synthesizer, a direct digital synthesizer (DDS) as shown in FIG. 7 is available. In this type of synthesizer, a frequency setting circuit 10 programs a phase increment 11 for unit clock corresponding to a frequency to be generated, the phase increase 11 is supplied as input to a phase accumulator 12, and accumulation of phase for unit clock of a clock signal 23 from the clock generator 21 is computed. A cumulative phase 13 is supplied as input to a ROM in which a value of sinusoidal waveform corresponding to each phase stored, and output from the ROM is connected to a D/A is convertor 15 and provided as output as a sinusoidal wave 16 converted into analog voltage. Analog output 16 is voltage sampled at a clock cycle, so that the waveform is as shown in FIG. 8A and includes many harmonic components. So a required synthesizer output 18 having a waveform as shown in FIG. 8B is obtained after removing the higher harmonic components by inserting a low-pass filter (LPF) 17. By introducing the configuration as described above which is not a feedback loop configuration, high speed switching has become possible.

However, the DDS shown in FIG. 7 uses a logic section (consisting of a phase accumulator and a ROM) and a D/A convertor to generate a signal, so that an operating speed of the DDS is limited by the two components above, and can hardly generate a relatively high frequency. Also, when trying to generate a relatively high frequency, the clock frequency must be made higher, which in turn makes power consumption in the logic circuit and the D/A convertor disadvantageously higher.

SUMMARY OF THE INVENTION

It is an object of the present invention to provide a frequency synthesizer which can be switched at a high speed and furthermore can generate a relatively high frequency with low power consumption.

A frequency synthesizer according to the present invention comprises a clock generating means, a frequency setting means in which a phase increment for a unit clock corresponding to a frequency to be generated according to input of a frequency set value is programmed, a phase accumulator to obtain a phase accumulation value by adding a phase increment set by this frequency setting means to a phase accumulation value by 1 clock before, waveform referring means for providing amplitude data corresponding to a cumulated phase output from the phase accumulator, a D/A convertor which converts amplitude data from the waveform referring means to an analog signal, and a bandpass filter which outputs filtered signals over a band of analog signals from this D/A convertor.

Also a frequency synthesizer according to the present invention comprises a clock generating means, frequency setting means in which a phase increment for unit clock corresponding to a frequency to be generated according to input of a frequency set value is programmed, a phase accumulator to obtain a phase accumulation value by adding a phase increment set by this frequency setting means to a phase accumulation value by 1 clock before, waveform referring means for providing amplitude data corresponding to a cumulated phase output from the phase accumulator, a frequency divider which divides a clock from the clock generating means into two halves, a D/A convertor which inputs amplitude data from the waveform referring means and divided output from the frequency divider, converts the amplitude data into an analog signal, and inverts the polarity of output for each clock cycle according to the logic of the divided output, and a filter which passes, of components of an analog signal from the D/A converter, only frequency components higher than $\frac{1}{2}$ of the clock frequency.

Also a frequency synthesizer according to the present invention comprises, clock generating means, frequency setting means in which a phase increment for unit clock corresponding to a frequency to be generated according to input of a frequency set value is programmed, a phase accumulator to obtain a phase accumulation value by adding a phase increment set by this frequency setting means to a phase accumulation value by 1 clock before, a waveform referring means for providing amplitude data corresponding to a cumulated phase output from the phase accumulator, a D/C convertor which converts amplitude data from the waveform referring means to an analog signal, and a filter which passes, of components of an analog signal from the D/A converter, only frequency components higher than $\frac{1}{2}$ of the clock frequency, wherein the most significant bit of the phase increment is "1".

Furthermore, a frequency synthesizer comprises in addition to the components of the synthesizer above, a phase comparator, to one input terminal of which output from the filter is supplied as input, a loop filter into which output from the phase comparator is supplied as input, a voltage controlled oscillator which is controlled by output from this loop filter, and a frequency divider circuit which divides output from this voltage controlled oscillator and supplies the divided output to another input terminal of the phase comparator to form a feedback loop, wherein output from the voltage controlled oscillator is signal output.

A feature of the present invention is that unnecessary frequency components generated by the DDS in FIG. 7 are positively utilized to generate a relatively high frequency. Analog output underwent D/A conversion by the DDS in FIG. 7 can be expressed by the convolution integration as shown below (EXPRESSION 1) with assuming $f_0$ as a clock frequency, $T_0$ as the periodic time, and $f_s$ as a sinusoidal wave frequency to be generated:

(EXPRESSION 1)
$$\left\{ \sum_{k=-\infty}^{\infty} \delta(t - kT_c) \cdot \cos 2\pi f_s t \right\} * x(t) =$$

$$\int_{-\infty}^{\infty} x(\tau) \sum_{k=-\infty}^{\infty} \delta(t - \tau - kT_c) \cdot \cos 2\pi f_s (t - \tau) d\tau$$

(* indicates convolution)

Herein x(t) is a single pulse having a pulse width of $T_0$. Fourier transformation of convolution integration is expressed by the product of Fourier transformation of each function for convolution integration. A waveform in a time domain and that in a frequency domain of each function are shown in Fig. 4. As shown in this figure, in a spectrum after D/A conversion, in addition to frequency components generally outputted in association with frequency $f_s$, frequency components of $nf_0 + f_s$ exist (n: an integral number). These frequencies can be programmed by the frequency setting circuit 10 in the DDS shown in FIG. 7 using the equation above. From the sampling theorem, the maximum value of the frequency $f_s$ is $\frac{1}{2} T_0$, and synthesizer output having a single frequency can be obtained by providing a band-pass filter which passes frequency components in a range from $nf_0-f_0/2$ to $nf_0$ or a band-pass filter which passes only frequency components in a range from $nf_0$ to $nf_0+f_0/2$ in the output side of the D/A convertor. Moreover, these frequencies are higher as compared to conventional ones.

The synthesizer output thus obtained is advantageous in that a higher frequency can be obtained with the same power consumption as that in the conventional technology, but the output level is lower. Especially in a domain around $nf_0$, amplitude comes closer to zero as clearly shown in FIG. 4, so that signal vs noise ratio (S/N) in the synthesizer output is sacrificed.

As a method of preventing the S/N ratio in synthesizer output from largely degrading, in the present invention, polarity of output is inverted in each clock cycle when D/A conversion is executed. By inverting polarity in each clock cycle, the D/A-converted output as shown in FIG. 5A can be obtained. This output signal has a waveform obtained by multiplying a sinusoidal wave having a frequency of $f_s$ with a continuous rectangular waves for each having a cycle of $\frac{1}{2} T_0$. This spectrum is expressed by convolution integration for waveforms obtained by Fourier transformation of the sinusoidal wave and continuous rectangular waves respectively, and has frequency components of $nf_0/2+f_s$ (n: odd number) as shown in FIG. 5B. The frequency components at this level are not affected by the frequency $f_s$, so that large drop of output level due to frequency never occurs. For this reason, synthesizer output can be obtained by connecting a band-pass filter which passes only frequency components in a range from $nf_0/2-f_0/2$ to $nf_0$ (n: odd number) or a band-pass filter which passes only frequency components in a range from $nf_0+f_0/2$ (n: odd number) behind the D/A convertor.

As a method of preventing a S/N ratio in synthesizer output from largely degrading in the DDS shown in FIG. 2, the most significant bit in phase increment supplied to the phase accumulator 12 as an input may be set to "1". With this method, the same effect as that achieved by inverting polarity of output in each clock cycle when D/A conversion is executed as described above is obtained.

In the present invention, the DDS according to the present invention is used as a reference frequency signal source based on a feedback loop or so-called PLL realized by phase comparison for the purpose to generate signals having a higher frequency than that generated by the synthesizers described above. As described before, the PLL switching time largely depends on characteristics of a loop filter in a feedback loop, and this is largely affected by a reference frequency. Namely a shorter switching time as compared to that for a conventional type of PLL can be realized by using a relatively higher frequency generated by the DDS according to the present invention as a reference frequency. A frequency generated by this frequency synthesizer is decided by a set frequency for the DDS and a frequency division ratio by a feedback loop frequency divider, so that a very wide range of frequencies can be generated.

Other objects and features of this invention will become understood from the following descriptions with reference to the accompanying drawings.

DESCRIPTION OF THE EMBODIMENTS

Figure 1:
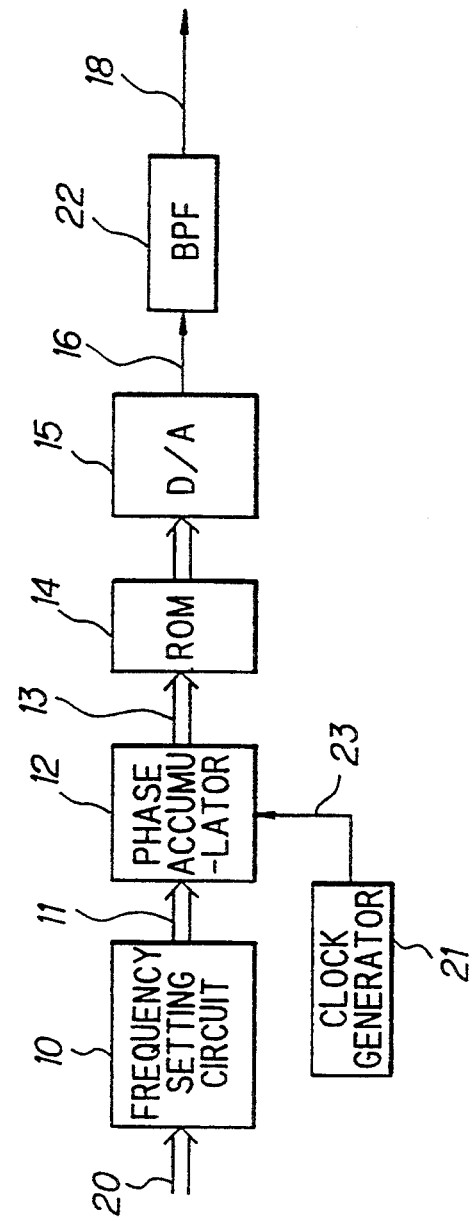
FIG. 1 is a block diagram illustrating a first embodiment of a direct digital synthesizer of the present invention.
Figure 7:
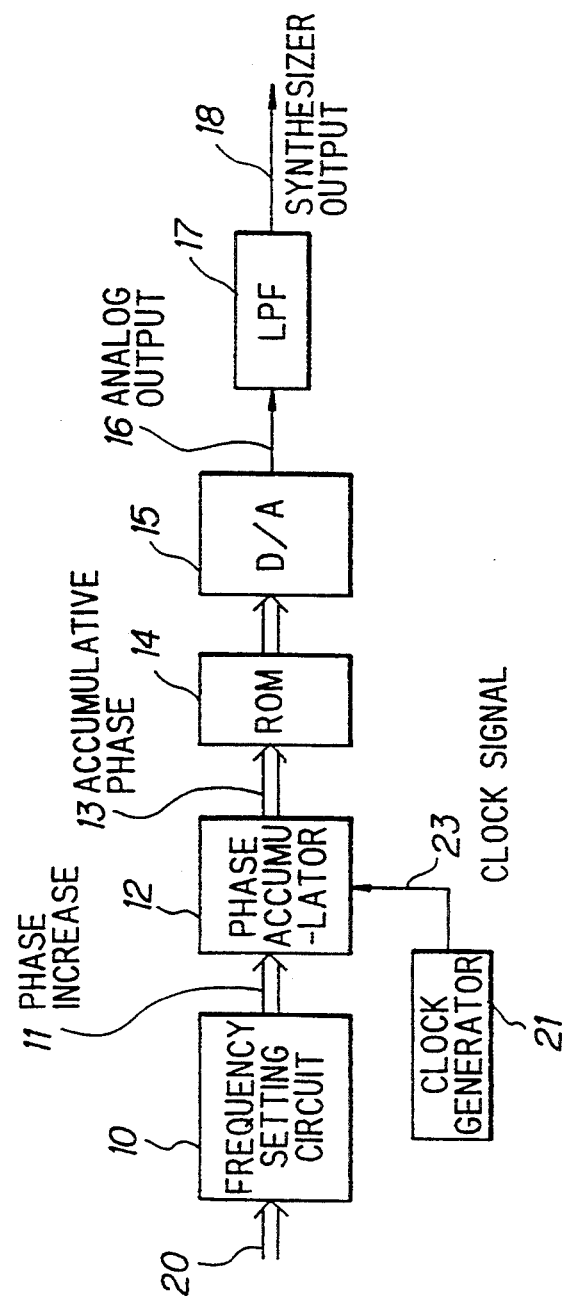
FIG. 7 is a block diagram illustrating configuration of a conventional type of direct digital synthesizer (DDS)
Figure 8A:
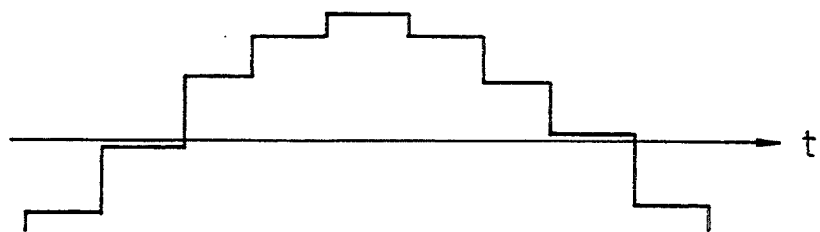
FIG. 8A is a view illustrating a waveform provided as output from the DDS.
Figure 8B:
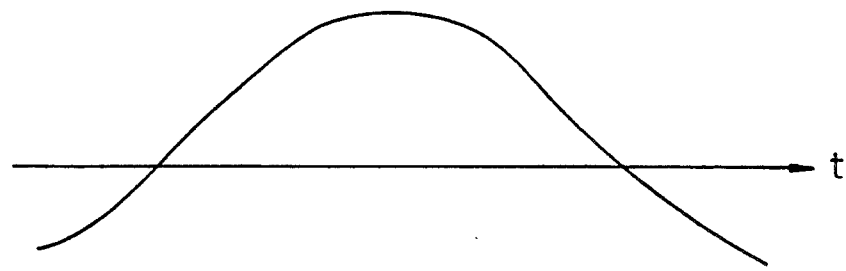
FIG. 8B is a view illustrating a waveform provided as output from the DDS.

FIG. 1 is a block diagram illustrating configuration of a frequency synthesizer according to the present invention, wherein a band-pass filter (BPF) 22 is used in place of a conventional type of DDS low pass filter 17 as shown in FIG. 7. The same reference numerals are assigned to the same components as those in FIG. 7. As detailed in relation to effects provided by the present invention, in a spectrum of output frequency from a D/A convertor 15 exist, in addition to frequency components generally output in association with the frequency fs, frequency components of $nf_0+f_s$ (n: integral number). For this reason, synthesizer output having a single frequency of $nf_0-f_s$ or $nf_0+f_s$ can be obtained by using a band-pass filter which passes only frequency components from $nf_0-f_0/2$ to $nf_0$ or a band-pass filter which passes only frequency components from $nf_0$ to $f_0+f_0/2$ in a band-pass filter 22.

Next, description is made of the operation of a frequency synthesizer according to the present invention. A frequency set value input 20 is supplied as input to the frequency setting circuit 10 to program phase increment 11 for unit clock corresponding to a frequency to be generated, and the phase increment 11 is supplied as input to the phase accumulator 12 to obtain accumulation of phases for each unit clock. The phase increment for unit clock is a value expressed by $2\pi f_s T_0$. The clock signal 23 is generated by the clock generator 21 and supplied as input to the phase accumulator 12. The cumulative phase 13 is supplied as input to the ROM 14 in which a value of sinusoidal waveform corresponding to each phase is stored, and output from the ROM is connected to the D/A convertor and provided as output as the signal 16 converted into analog voltage. Signals from the frequency setting circuit 10 to the D/A convertor 15 are digital signals each consisting of a plurality of bits. For the necessity to process signals at a high speed, these digital signals are generally transferred in parallel through a plurality of lines. Analog output 16 is connected to the band-pass filter 22, which outputs a sinusoidal wave signal 18 having a single frequency component.

Figure 2:
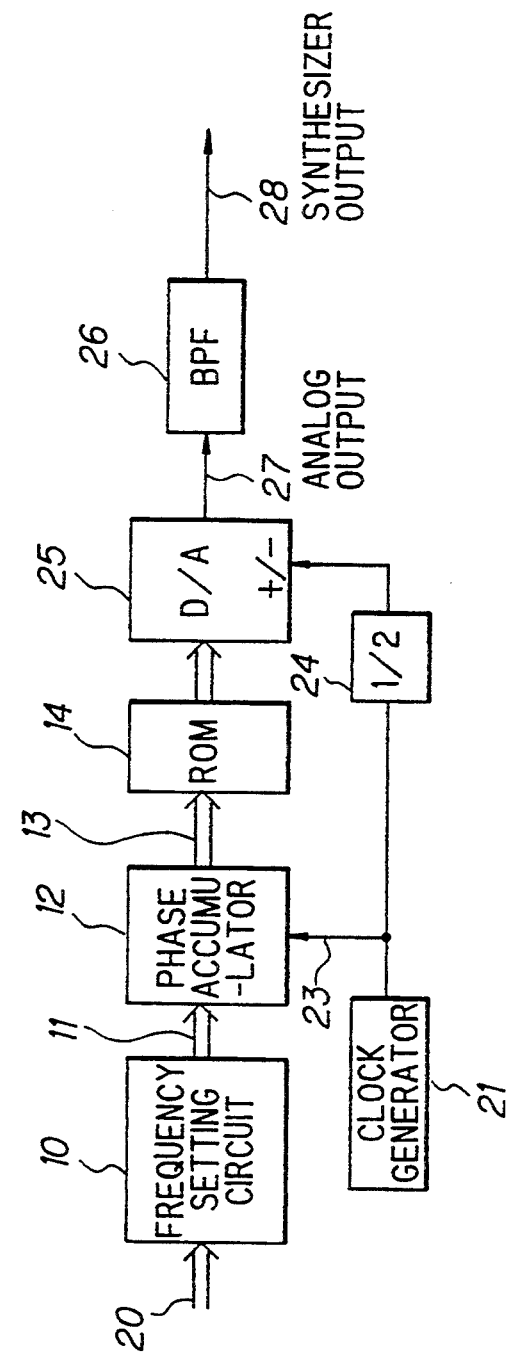
FIG. 2 is a block diagram illustrating a second embodiment of a direct digital synthesizer of the present invention.

FIG. 2 is a block diagram illustrating an embodiment of the present invention wherein the polarity of output from a D/A converter is inverted in each clock cycle. The frequency setting circuit 10, phase accumulator 12, clock generator 21, and ROM 14 are the same as those shown in FIG. 1. The frequency synthesizer according to this embodiment of the present invention includes the frequency divider circuit 24 which divides an output signal from the clock generator 21 in two and supplies the divided clock signal to the D/A convertor 25. As the band-pass filter 26, a band-pass filter 26 which passes only frequency components from $nf_0/2-f0/2$ to $nf_0$ (n:odd number) or a band-pass filter which passes only frequency components from $nf_0$ to $nf_0/2+f_0/2$ (n:odd number) is used. Alternatively, $nf_0/2 \pm of/2$ can be stated as $mfo$, where $m=(n\pm1)/2$.

Operations of the frequency setting circuit 10, phase accumulator 12, and ROM 14 are the same as those in FIG. 1. To the D/A convertor is connected a clock signal divided into a half (½) by the frequency divider circuit 24 as described above, and polarity of output from the D/A convertor is inverted according to the logic of "1" or "0". The analog output 27 is connected to the band-pass filter (BPF) 26, which outputs the sinusoidal wave signal 28 having a single frequency component. The band-pass filter 26 can pick up a frequency component of $f_0/2+fs$ by setting, for instance, a low band cut-off frequency to $f_0/2$ and a high band cut-off frequency to $f_0$.

It should be noted that, as described in relation to the effects of the present invention, the same effect can be achieved by setting the most significant bit of phase increment supplied to "input" to the phase accumulator 12 as "1" without inverting polarity of the output in each clock cycle when executing D/A conversion. In the DDS having the configuration as shown in FIG. 1, which is an embodiment of the present invention based on this concept, the most significant bit of phase increment is set to "1".

Figure 3:
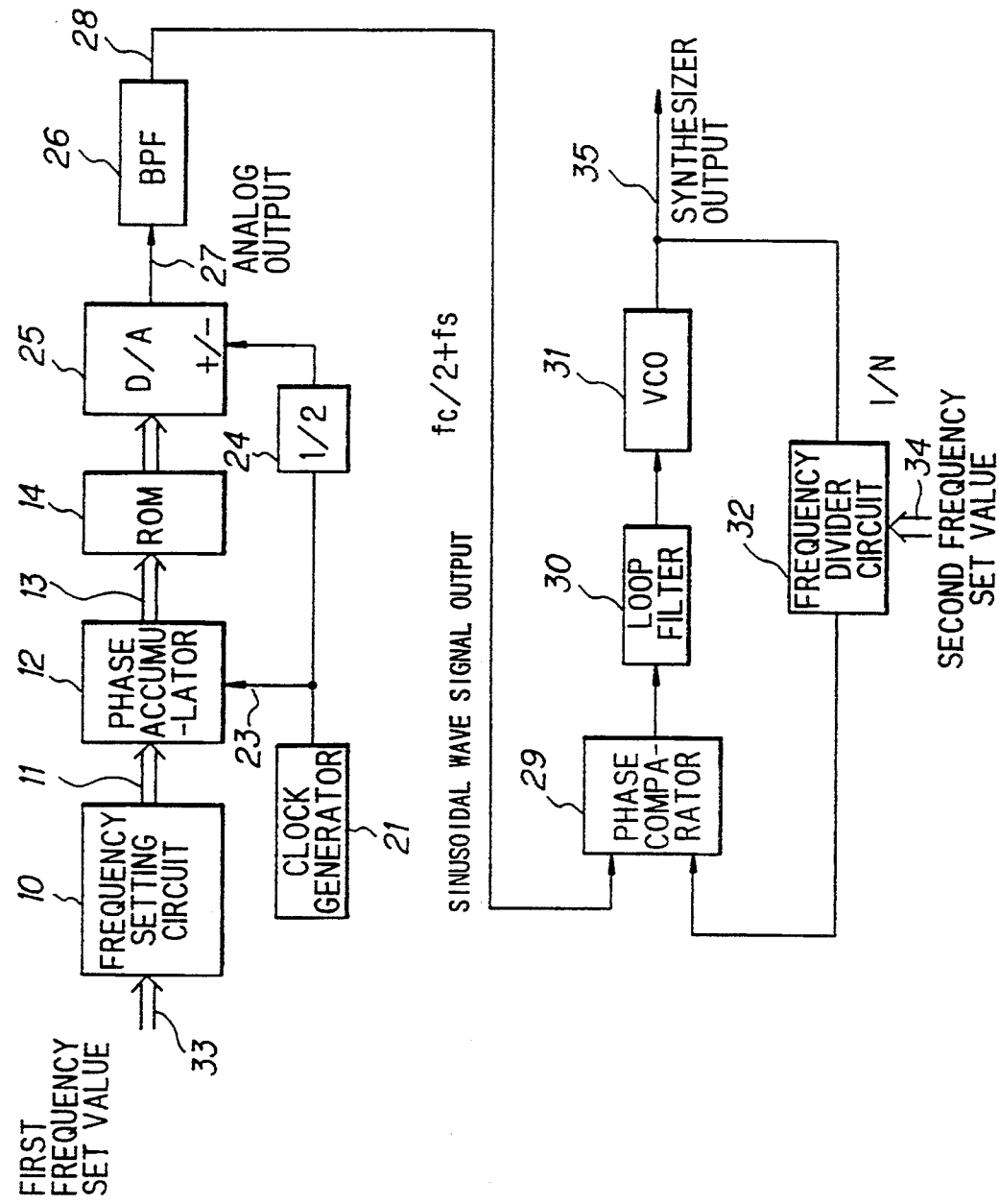
FIG. 3 is a block diagram illustrating an embodiment of the present invention wherein the direct digital synthesizer provides a reference input to a phase locked loop.
Figure 4:
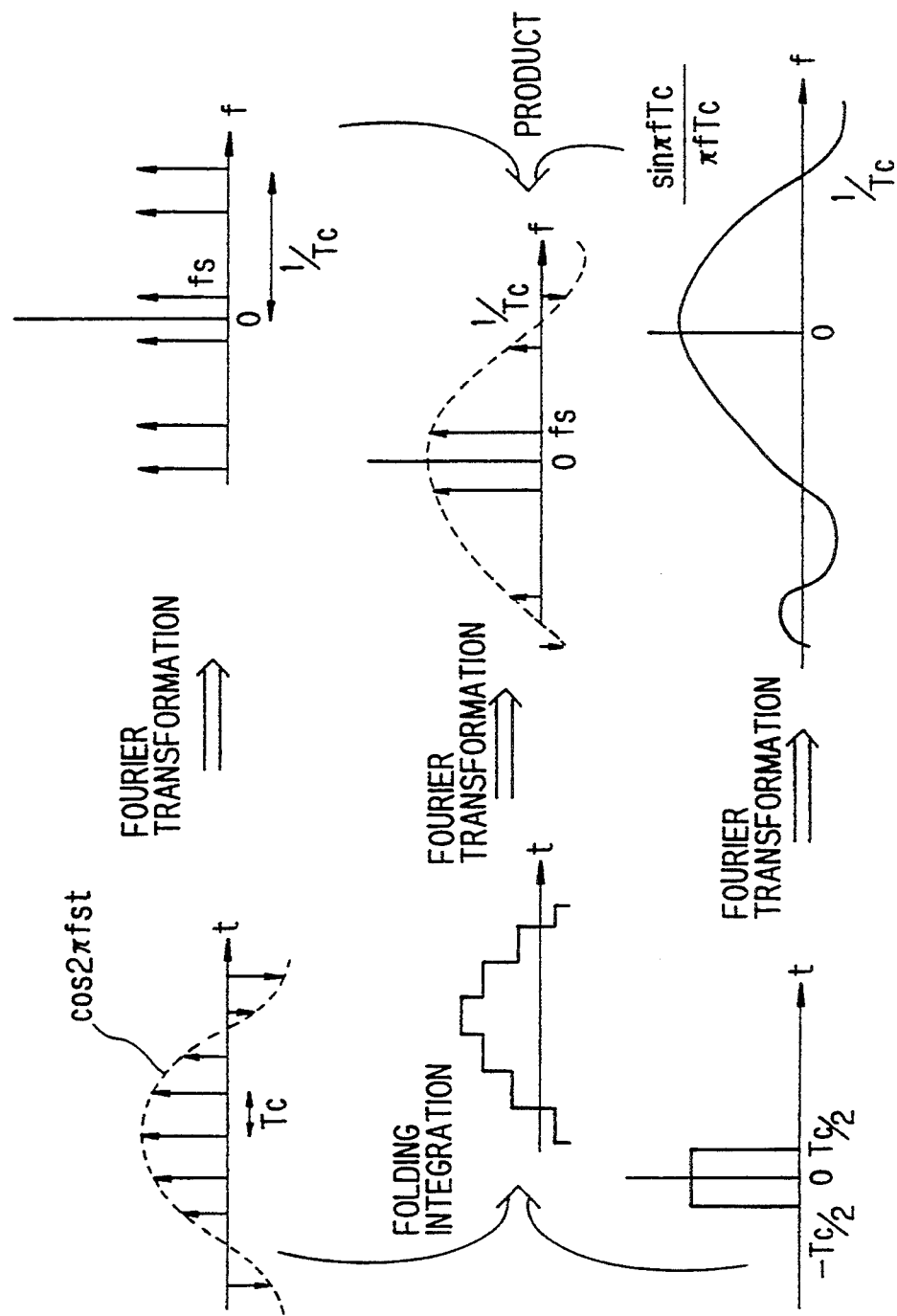
FIG. 4 is a view illustrating a time domain waveform as well as a frequency domain waveform in the DDS output.
Figure 5A:
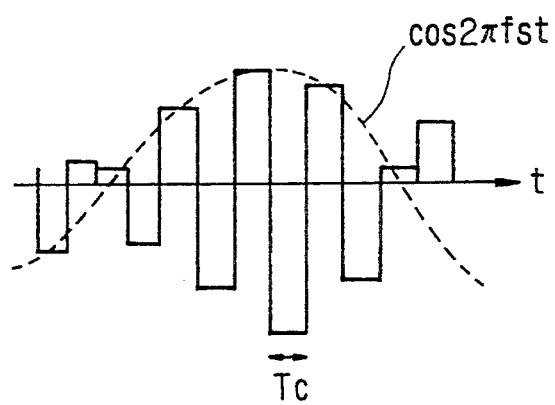
FIG. 5A is a view illustrating a waveform in an time domain for explanation of a principle of the present invention.
Figure 5B:
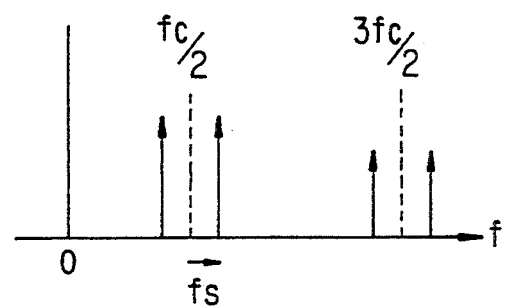
FIG. 5B is a view illustrating a waveform in a frequency domain for explanation of a principle of the present invention.
Figure 6:
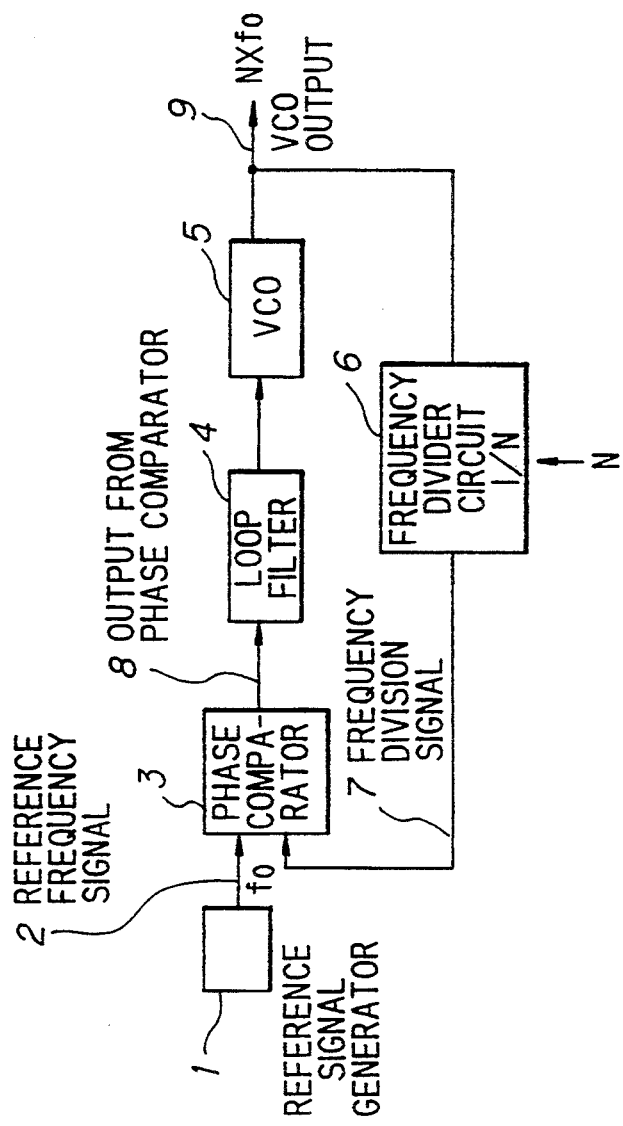
FIG. 6 is a block diagram illustrating configuration of a conventional type of frequency synthesizer.

FIG. 3 is a block diagram illustrating an embodiment of the present invention in which a conventional type of frequency synthesizer as shown in FIG. 6 is connected to the DDS shown in FIG. 2. A phase comparator 29, a loop filter 30, a VCO 31, and a 1/N frequency divider circuit are inserted behind the band-pass filter 26.

In the present embodiment, a first frequency set value 33 is supplied as input to the frequency setting circuit 10, and a second frequency set value 34 is supplied as input to a frequency divider circuit 32. A sinusoidal wave signal output 28 of $f_0/2+fs$ from the band-pass filter 26 described in relation to the embodiment of the present invention shown in FIG. 2 is connected as a reference frequency signal source to the phase comparator 29. A signal obtained by dividing output from the VCO 31 by N with the frequency divider 32 is supplied as input to another input terminal of the phase comparator 29. Output from the phase comparator is supplied as input to the loop filter 30 and then connected to the VCO to form a feedback loop. A frequency division ratio N in the frequency divider circuit 32 can be programmed according to a second frequency set value input 34, and the VCO 31 outputs a frequency of $N\times(f_0/2+fs)$ as a synthesizer output 35.

In the embodiment shown in FIG. 3, the synthesizer shown in FIG. 6 is connected to the DDS shown in FIG. 2, but also the synthesizer shown in FIG. 6 can be connected to the DDS shown in FIG. 1.

As described above, the present invention advantageously provides a synthesizer which is based on a relatively simple circuit configuration, yet can switch a frequency at a high speed. Also the synthesizer can generate a wide range of frequencies without losing the advantage described above, when it is necessary to generate an extremely high frequency.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A frequency synthesizer comprising:
    a clock generator for generating a clock frequency of;
    a frequency setting circuit in which a phase increment corresponding to a frequency to be generated is programmed according to an input of a frequency set value;
    a phase accumulator responsive to said clock frequency of and to said phase increment for adding said phase increment to a phase cumulative value to generate a revised phase cumulative value,
    a waveform generating circuit for providing output amplitude data in response to said revised phase cumulative value from said phase accumulator;
    a frequency divider which divides said clock frequency of from said clock generator by two;

a D/A convertor to which said output amplitude data from said waveform generating circuit and a divided output frequency from said frequency divider are supplied as inputs, and which converts said amplitude data into an analog signal, said analog signal alternating polarity with each clock cycle; and a filter which passes, of components of an analog signal from said D/A convertor, only frequency components higher than ½ of said clock frequency of.

2. A frequency synthesizer according to claim 1, wherein said filter is a band-pass filter, a high band cut-off frequency of said band-pass filter is less than nfo/2, wherein n is an odd number, excluding 1, and a low band cut-off frequency of said band-pass filter is higher than mfo, where m is an integral number equal to (n−1)/2.

3. A frequency synthesizer according to claim 1, wherein said filter is a band-pass filter, a low band cut-off frequency of said band-pass filter is not less than nfo/2, where n is an odd number excluding 1, and a high band cut-off frequency is lower than mfo, where m is an integral number equal to (n+1)/2.

4. A frequency synthesizer according to claim 1, further comprising:

a phase comparator to one input terminal of which is supplied the output signal from said filter;

a loop filter into which an output from said phase comparator is supplied as an input;

a voltage controlled oscillator controlled according to output from said loop filter; and a frequency divider which divides an output from said voltage controlled oscillator and applies said divided output to another input terminal of said phase comparator to form a feedback loop;

wherein an output from said voltage controlled oscillator is the synthesizer output.

5. A frequency synthesizer comprising:

a clock generator for generating a clock frequency of;

a frequency setting circuit in which a phase increment corresponding to a frequency to be generated is programmed according to an input of a frequency set value;

a phase accumulator responsive to said clock frequency of and to said phase increment for adding said phase increment set by said frequency setting circuit to a phase cumulative value to generate a revised phase cumulative value, a waveform generating circuit for providing output amplitude data in response to said revised phase cumulative value from said phase accumulator;

a D/A convertor which converts said amplitude data from said waveform generating circuit to an analog signal; and a filter which passes, of components of an analog signal from said D/A convertor, only frequency components higher than ½ of said clock frequency of, wherein the most significant bit in said phase increment is regarded and processed as "1".

6. A frequency synthesizer according to claim 5, wherein said filter is a band-pass filter, a high band cut-off frequency of said band-pass filter is less than nfo, where n is an odd number excluding 1, and a low band cut-off frequency of said band-pass filter is higher than mfo where m is an integral number equal to (n−1)/2.

7. A frequency synthesizer according to claim 5, wherein said filter is a band-pass filter, a low band cut-off frequency of said band-pass filter is not less than nfo/2, where n is an odd number, and a high band cut-off frequency of said band-pass filter is lower than mfo, where m is an integral number equal to (n+1)/2.

8. A frequency synthesizer according to claim 5, further comprising:

a phase comparator, to one input terminal of which is supplied the output signal from said filter;

a loop filter into which an output from said phase comparator is supplied as an input;

a voltage controlled oscillator controlled according to output from said loop filter; and a frequency divider which divides an output from said voltage controlled oscillator and applies said divided output to another input terminal of said phase comparator to form a feedback loop;

wherein an output from said voltage controlled oscillator is the synthesizer output.

* * * * *